US006686649B1

(12) United States Patent
Mathews et al.

(10) Patent No.: US 6,686,649 B1
(45) Date of Patent: Feb. 3, 2004

(54) MULTI-CHIP SEMICONDUCTOR PACKAGE WITH INTEGRAL SHIELD AND ANTENNA

(75) Inventors: Douglas Jay Mathews, Gilbert, AZ (US); Robert Joseph Hill, Salinas, CA (US); Michael Paul Gaynor, Chandler, AZ (US); Ronald James Schoonejongen, Chandler, AZ (US); John Armando Miranda, Chandler, AZ (US); Christopher Marc Scanlan, Phoenix, AZ (US)

(73) Assignees: Amkor Technology, Inc., Chandler, AZ (US); Tyco Electronics Logistics AG (CH)

( * ) Notice: Subject to any disclaimer, the term of this patent is extended or adjusted under 35 U.S.C. 154(b) by 63 days.

(21) Appl. No.: 09/855,244

(22) Filed: May 14, 2001

(51) Int. Cl.⁷ .............................................. H01L 23/552
(52) U.S. Cl. ......................... 257/659; 257/687; 257/690
(58) Field of Search ................................ 257/659, 678, 257/687, 690; 361/816, 820; 343/841

(56) References Cited

U.S. PATENT DOCUMENTS

| 4,868,639 A | * | 9/1989 | Mugiya et al. ................ 357/74 |
| 5,166,772 A | | 11/1992 | Soldner et al. ............. 257/659 |
| 6,472,598 B1 | * | 10/2002 | Glenn ........................ 174/52.2 |
| 6,476,463 B1 | * | 11/2002 | Kaneko et al. ............. 257/660 |
| 2002/0167060 A1 | * | 11/2002 | Bujisman et al. ........... 257/423 |

* cited by examiner

Primary Examiner—Richard Elms
Assistant Examiner—Brad Smith
(74) Attorney, Agent, or Firm—Gunnison, McKay & Hodgson, L.L.P.; Serge J. Hodgson

(57) ABSTRACT

A transceiver package includes a substrate having an upper surface. An electronic component is mounted to the upper surface of the substrate. A shield encloses the electronic component and shields the electronic component from radiation. The transceiver package further includes an antenna and a dielectric cap. The dielectric cap is interposed between the shield and the antenna, the shield being a ground plane for the antenna.

11 Claims, 8 Drawing Sheets

FIG. 8

MULTI-CHIP SEMICONDUCTOR PACKAGE WITH INTEGRAL SHIELD AND ANTENNA

BACKGROUND OF THE INVENTION

1. Field of the Invention

The present invention relates generally to the packaging of electronic components. More particularly, the present invention relates to a shielded electronic component module and method of fabricating the same.

2. Description of the Related Art

As the art moved to smaller, lighter weight, and higher frequency electronic devices such as cellular telephones, integrated circuit packages utilized in these electronic devices were increasingly placed closer to other electronic components and structures. Due to this reduced spacing, radiation such as electromagnetic or radio frequency (RF) radiation emanating from an integrated circuit package had a greater probability of interfering with the normal operation of an adjacent electronic component and vice versa. However, such interference was unacceptable depending upon the particular application.

Further, to prevent interfering with the normal operation of adjacent electronic devices, e.g., radio receivers, it was important to prevent the integrated circuit package from emanating unwanted radiation to the ambient air. Similarly, to prevent interfering with the normal operation of the integrated circuit package, it was important to protect the electronic component(s) of the integrated circuit package from radiation emanating from adjacent electronic devices, e.g., radio transmitters. Stated generally, it was important to prevent unwanted radiation from electronic component(s) of the integrated circuit package from reaching the surrounding air and vice versa.

To prevent unacceptable electromagnetic interference, a shielding system was used. Typically, an electrically conductive metallic enclosure was placed around the integrated circuit package after the integrated circuit package was mounted to the larger substrate such as the printed circuit mother board. However, fabricating such a metallic enclosure and separately attaching the metallic enclosure to the printed circuit mother board was relatively cumbersome, complex, and costly.

SUMMARY OF THE INVENTION

In accordance with the present invention, a transceiver package includes a substrate having an upper surface. An electronic component is mounted to the upper surface of the substrate. A shield encloses the electronic component and shields the electronic component from radiation. The transceiver package further includes an antenna and a dielectric cap. The dielectric cap is interposed between the shield and the antenna, the shield being a ground plane for the antenna.

Advantageously, the shield serves a least two functions. First, the shield shields the electronic component from radiation. More particularly, the shield prevents the electronic component from receiving unwanted radiation, e.g., generated by the antenna or receive from the surrounding air. Further, the shield prevents the electronic component from emanating unwanted radiation, e.g., to electronic components adjacent the transceiver package or to the surrounding air. Accordingly, the transceiver package in accordance with the present invention is well suited for wireless applications such as portable radio transmitters, portable telephones, portable radio receivers or other high frequency applications, which require shielding of electronic components.

Recall that in the prior art, shielding was accomplished by placing an electrically conductive metallic enclosure around the integrated circuit package after the integrated circuit package was mounted to the larger substrate such as the printed circuit mother board. By eliminating this electrically conductive metallic enclosure, an electronic device, e.g., cellular telephone, employing the transceiver package in accordance with the present invention is fabricated to be smaller, lighter and less expensive than an electronic device of the prior art.

Second, the shield is a ground plane for the antenna. Advantageously, the antenna is fabricated as part of the transceiver package. This is in stark contrast to the prior art where the antenna, which was a structure separate from the integrated circuit package, was attached separately to the printed circuit mother board.

By incorporating the antenna into the transceiver package, an electronic device, e.g., cellular telephone, employing the transceiver package in accordance with present invention is fabricated to be smaller, lighter and less expensive than an electronic device of the prior art.

Further, by incorporating the antenna into the transceiver package, the transceiver package is highly manufacturable compared to the prior art. As set forth above, the antenna of the prior art was attached separately to the printed circuit mother board. Disadvantageously, attaching the antenna at the printed circuit mother board stage of fabrication was labor intensive, complex and thus expensive. Further, specialized expertise, e.g., in RF circuitry, was required in designing and attaching the antenna to the printed circuit mother board.

In stark contrast to the prior art, the antenna is incorporated into the transceiver package. This simplifies manufacturing at the printed circuit mother board stage of fabrication thus reducing cost. Further, the transceiver package is an off-the-shelf part and no specialized expertise is required to use the transceiver package. This allows a wide variety of manufacturers to use the transceiver package to enter into the wireless marketplace.

These and other features and advantages of the present invention will be more readily apparent from the detailed description set forth below taken in conjunction with the accompanying drawings.

BRIEF DESCRIPTION OF THE DRAWINGS

FIG. 8 is a cross-sectional view of the multi-chip transceiver package along the line VIII—VIII of FIG. 7.

In the following description, the same or similar elements are labeled with the same or similar reference numbers.

DETAILED DESCRIPTION

Figure 1:
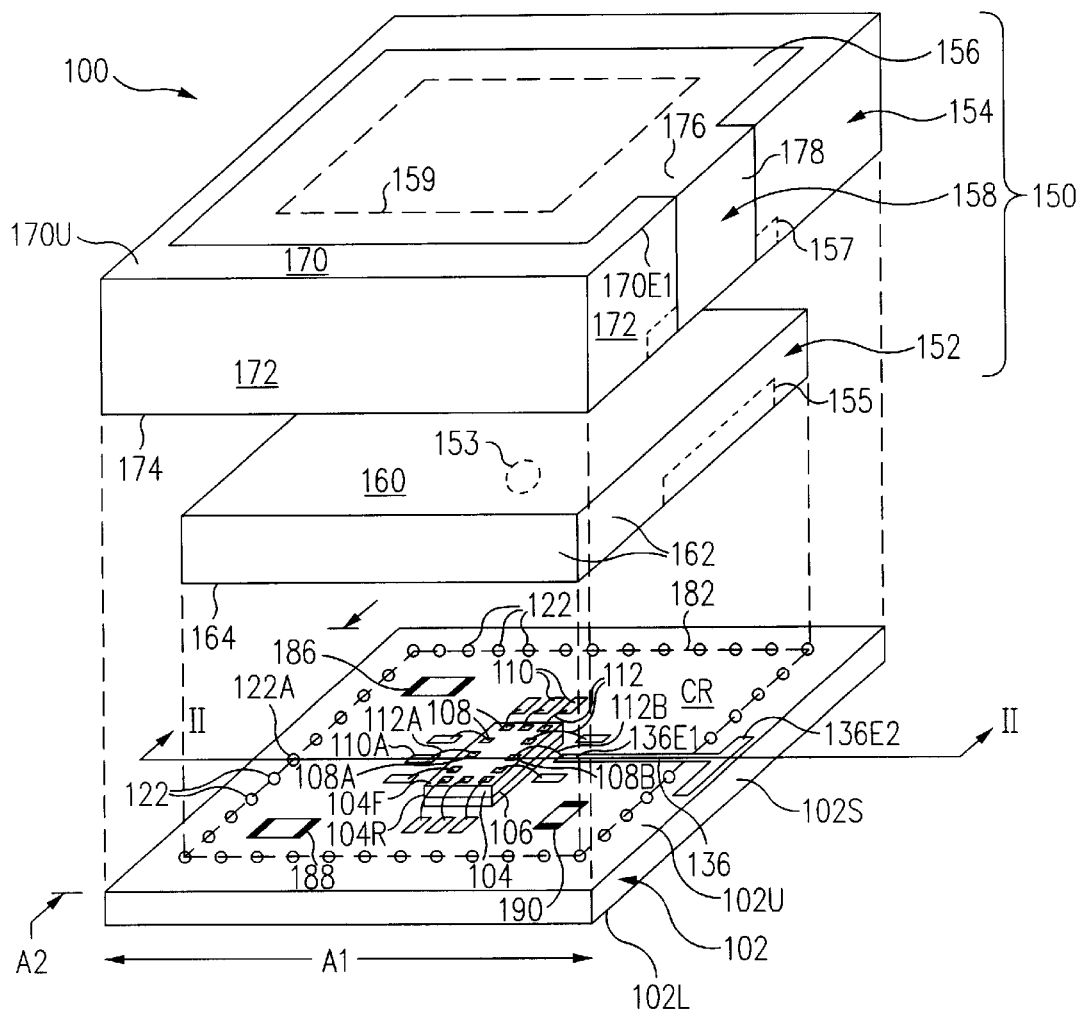
FIG. 1 is an exploded perspective view of a transceiver package in accordance with one embodiment of the present invention.

In accordance with the present invention, a transceiver package 100 (FIGS. 1 and 2) includes a substrate 102 having an upper surface 102U. An electronic component 104 is mounted to upper surface 102U of substrate 102. A shield 152 encloses electronic component 104 and shields electronic component 104 from radiation. Transceiver package 100 further includes an antenna 156 and a dielectric cap 154. Dielectric cap 154 is interposed between shield 152 and antenna 156, shield 152 being a ground plane for antenna 156.

Figure 2:
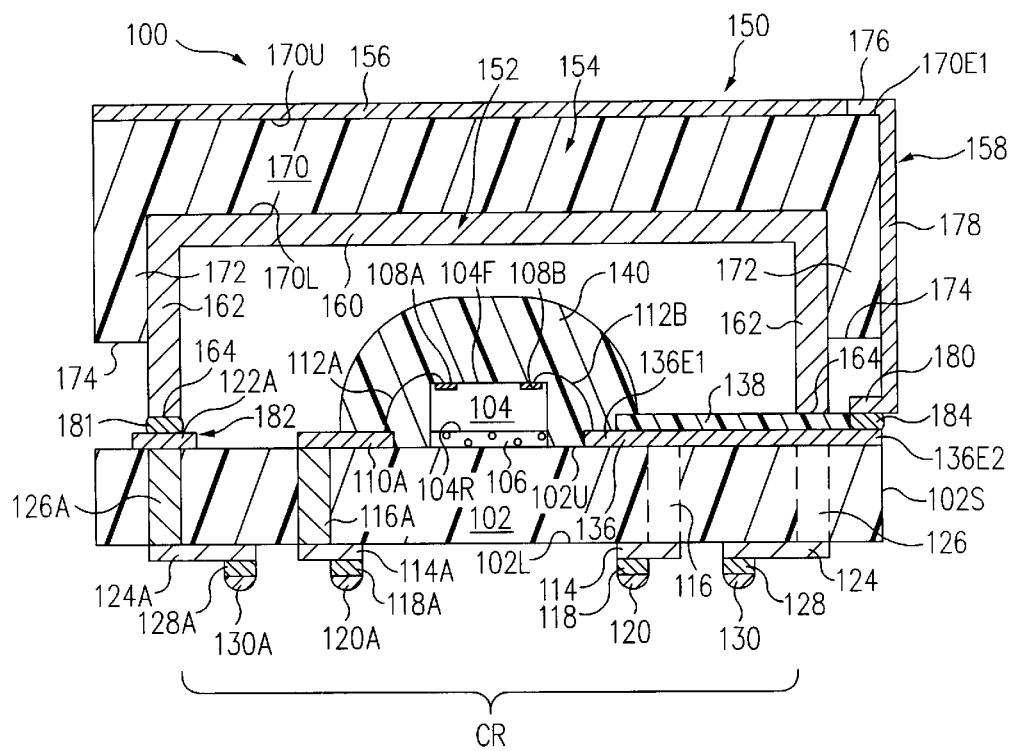
FIG. 2 is a cross-sectional view of the transceiver package along the line II—II of FIG. 1.

More particularly, FIG. 1 is an exploded perspective view of a transceiver package 100 in accordance with one embodiment of the present invention. FIG. 2 is a cross-sectional view of transceiver package 100 along the line II—II of FIG. 1.

Referring now to FIGS. 1 and 2 together, transceiver package 100 includes a substrate 102 such as a printed circuit board, ceramic or tape although other materials are used in other embodiments. Substrate 102 includes an upper, e.g., first, surface 102U and a lower, e.g., second, surface 102L. An illustrative specification for characteristics A1, A2 in FIG. 1 is 15.0 mm although it is understood that different specifications for characteristics A1, A2 are used in alternative embodiments.

An electronic component 104 such as an integrated circuit is mounted to upper surface 102U with, for example, adhesive 106. More particularly, a rear, e.g., first, surface 104R of electronic component 104 is mounted to upper surface 102U of substrate 102 by adhesive 106.

A front, e.g., second, surface 104F of electronic component 104 has formed thereon bond pads 108 including a first bond pad 108A. Bond pads 108 are electrically connected to the various internal circuitry of electronic component 104 (not shown).

Formed on upper surface 102U of substrate 102 are a plurality of electrically conductive upper traces 110 including a first upper trace 110A. Bond pads 108 are electrically connected to upper traces 110 by electrically conductive bond wires 112. To illustrate, bond pad 108A is electrically connected to upper trace 110A by a first bond wire 112A of the plurality of bond wires 112. The other bond pads 108 are electrically connected to the other upper traces 110 by the other bond wires 112 in a similar manner so are not discussed further to avoid detracting from the principals of the invention.

Formed on lower surface 102L of substrate 102 are a plurality of electrically conductive lower traces 114 including a first lower trace 114A. Upper traces 110 are electrically connected to lower traces 114 by electrically conductive vias 116 extending through substrate 102 from upper surface 102U to lower surface 102L. To illustrate, upper trace 110A is electrically connected to lower trace 114A by a first via 116A of the plurality of vias 116. The location of a via 116, which otherwise would not be visible in the cross-sectional view of FIG. 2, is indicated by dashed lines. The other upper traces 110 are electrically connected to the other lower traces 114 by the other vias 116 in a similar manner so are not discussed further to avoid detracting from the principals of the invention.

Formed on lower traces 114 are electrically conductive pads 118. To illustrate, a first pad 118A of the plurality of pads 118 is formed on and electrically connected to lower trace 114A. Formed on and electrically connected to pads 118 are electrically conductive interconnection balls 120, e.g., solder. To illustrate, a first interconnection ball 120A of the plurality of interconnection balls 120 is formed on and electrically connected to pad 118A.

As set forth above, an electrically conductive pathway between bond pad 108A and interconnection ball 120A is formed by bond wire 112A, upper trace 110A, via 116A, lower trace 114A and pad 118A. Except as indicated below, the other bond pads 108, bond wires 112, upper traces 110, vias 116, lower traces 114, pads 118 and interconnection balls 120 are electrically connected to one another in a similar fashion so are not discussed further to avoid detracting from the principals of the invention.

Also formed on upper surface 102U of substrate 102 are electrically conductive upper ground traces 122, sometimes called upper ground lands. Formed on lower surface 102L of substrate 102 are electrically conductive lower ground traces 124 including a first lower ground trace 124A. Although upper ground traces 122 appear circular when viewed from above in FIG. 1, in other embodiments, upper ground traces 122 have other shapes, e.g., are rectangular or square. As yet another alternative, each upper ground trace 122 is electrically connected to the adjacent upper ground traces 122. For example, upper ground traces 122 are integrally connected to one another and form a shape similar to a rectangular annulus around the entire periphery of upper surface 102U.

Upper ground traces 122 are electrically connected to lower ground traces 124 by electrically conductive ground vias 126 extending through substrate 102 from upper surface 102U to lower surface 102L. To illustrate, a first upper ground trace 122A of the plurality of upper ground traces 122 is electrically connected to lower ground trace 124A by a first ground via 126A of the plurality of ground vias 126. The location of a ground via 126, which otherwise would not be visible in the cross-sectional view of FIG. 2, is indicated by dashed lines.

Formed on lower ground traces 124 are electrically conductive ground pads 128. To illustrate, a first ground pad 128A of the plurality of ground pads 128 is formed on and electrically connected to lower ground trace 124A. Formed on and electrically connected to ground pads 128 are electrically conductive ground interconnection balls 130, e.g., solder. To illustrate, a first ground interconnection ball 130A of the plurality of ground interconnection balls 130 is formed on ground pad 128A.

As set forth above, an electrically conductive pathway between upper ground trace 122A and ground interconnection ball 130A is formed by ground via 126A, lower ground trace 124A and ground pad 128A. Generally, transceiver package 100 includes at least one upper ground trace 122, ground via 126, lower ground trace 124, ground pad 128 and ground interconnection ball 130. The other upper ground traces 122, ground vias 126, lower ground traces 124, ground pads 128 and ground interconnection balls 130, if any, are electrically connected to one another in a similar fashion so are not discussed further to avoid detracting from the principals of the invention.

Although particular electrically conductive pathways between bond pad 108A, upper ground trace 122A and interconnection ball 120A, ground interconnection ball 130A, respectively, are described above, in light of this disclosure, it is understood that other electrically conductive pathways can be formed. For example, substrate 102 is a multi-layered laminate substrate and, instead of straight-through vias 116, 126, a plurality of electrically conductive traces on various layers in substrate 102 are interconnected by a plurality of electrically conductive vias to form the electrical interconnections between traces 110A, 122A and 114A, 124A, respectively.

In one embodiment, interconnection balls 120, 130 are distributed in an array format to form a ball grid array (BGA) package. Alternatively, interconnection balls 120, 130 are not formed, e.g., to form a metal land grid array (LGA) package or a leadless chip carrier (LCC) package. In another alternative, pads 118, 128 are not formed and interconnection balls 120, 130 are formed directly on lower traces 114, 124, respectively. Further, contact metallizations are interposed between the various conductors in other embodiments. Other electrically conductive pathway modifications will be obvious to those of skill in the art.

Also formed on upper surface 102U of substrate 102 is an antenna trace 136. Antenna trace 136 is electrically connected to a second bond pad 108B of the plurality of bond pads 108 by a second bond wire 112B of the plurality of bond wires 112. Antenna trace 136 extends to and terminates at a periphery of upper surface 102U of substrate 102 adjacent a side 102S of substrate 102.

A dielectric layer 138, e.g., solder mask, is formed on and protects the central portion of antenna trace 136. More particularly, a first end 136E1 of antenna trace 136 adjacent electronic component 104 is not covered by dielectric layer 138 and thus exposed. Dielectric layer 138 is not illustrated in FIG. 1 for purposes of clarity. Further, a second end 136E2 of antenna trace 136 adjacent side 102S is not covered by dielectric layer 138 and thus exposed. In one embodiment, dielectric layer 138 also covers and protects portions of upper traces 110 and/or upper ground traces 122. A similar dielectric layer, e.g., solder mask, is formed on lower surface 102L to protect lower traces 114 and lower ground traces 124 in one embodiment.

Although a direct connection between bond pad 108B and second end 136E2 of antenna trace 136 by bond wire 112B is illustrated, in an alternative embodiment, one or more electronic components, e.g., a balun filter, is interposed between bond pad 108B and second end 136E2. The one or more electronic components are mounted to upper surface 102U and/or are embedded within substrate 102.

As shown in FIG. 2, electronic component 104 including bond wires 112 are protected by an encapsulant 140, sometimes called glob top encapsulated. For simplicity, encapsulant 140 is not illustrated in FIG. 1. In an alternative embodiment, a shield 152 includes one or more apertures 153 (FIG. 1), and encapsulant 140 is applied through apertures 153 to fill the cavity defined by shield 152 and upper surface 102U of substrate 102 thus entirely encapsulating electronic component 104 and bond wires 112. As those of skill in the art will understand, by forming apertures 153 with a sufficiently small diameter, radiation is prevented from passing through apertures 153.

Transceiver package 100 further includes an antenna shield assembly 150. In this embodiment, antenna shield assembly 150 includes shield 152, a dielectric cap 154, an antenna 156, and an antenna strap 158.

Figure 3:
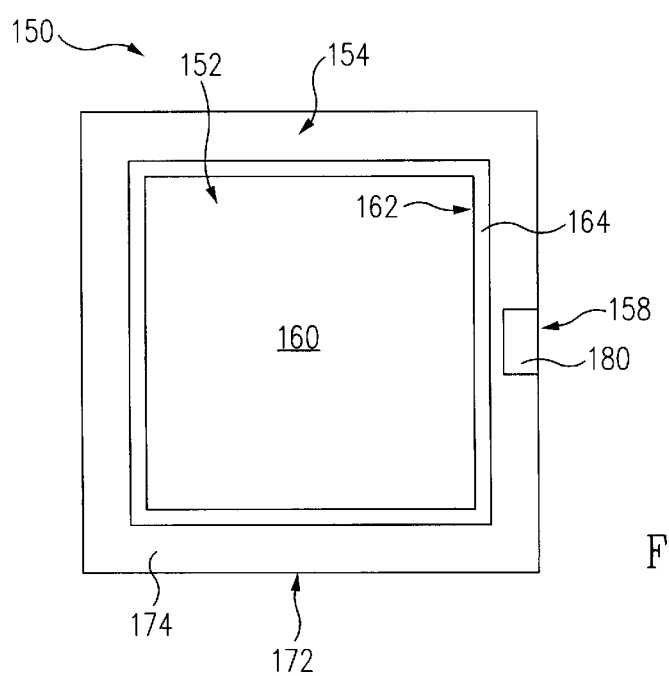
FIG. 3 is a bottom plan view of an antenna shield assembly of the transceiver package of FIGS. 1 and 2 in accordance with one embodiment of present invention.

FIG. 3 is a bottom plan view of antenna shield assembly 150 of transceiver package 100 of FIGS. 1 and 2 in accordance with one embodiment of the present invention. Referring now to FIGS. 1, 2 and 3 together, shield 152 is formed of an electrically conductive material. Illustratively, shield 152 is formed of a stamped, formed or deposited metal such as stainless-steel, copper or tin alloy. In this embodiment, shield 152 is in the shape of a hollow rectangular box having its bottom missing. Stated another way, shield 152 is a rectangular lid.

Shield 152 includes a body 160 and a sidewall 162 extending downwards from body 160. Sidewall 162 terminates at a shield connection surface 164 of shield 152. In this embodiment, shield connection surface 164 is a rectangular, e.g., square, annulus. In one embodiment, shield 152 is continuous, i.e., is formed without any apertures, holes, or other openings.

Shield 152 is enclosed, sometimes called captured, within dielectric cap 154, which is formed of a dielectric material such as plastic or ceramic although other dielectric materials are used in other embodiments. In this embodiment, dielectric cap 154 is shaped similar to shield 152, but larger. Specifically, dielectric cap 154 includes a body 170 and a sidewall 172 extending downwards from body 170. Sidewall 172 terminates at a sidewall surface 174 of dielectric cap 154. In this embodiment, sidewall surface 174 is a rectangular, e.g., square, annulus.

Although shield 152 and dielectric cap 154 are illustrated as rectangular structures, in alternative embodiments, shield 152 and dielectric cap 154 are formed in other shapes, e.g., circular. More generally, transceiver package 100 can be formed in a variety of shapes, e.g., rectangular or circular. Further, in one embodiment, shield 152 and dielectric cap 154 include cut outs 155, 157 (FIG. 1), respectively, and antenna trace 136 extends from end 136E1, through cut outs 155, 157, to end 136E2. In this manner, the use of dielectric layer 138 to prevent electrical shorting between shield 152 and antenna trace 136 is unnecessary.

In one embodiment, a plane defined by sidewall surface 174 is located vertically between a plane defined by body 160 and a plane defined by shield connection surface 164 of shield 152. Stated another way, shield 152 extends further downwards towards substrate 102 than does dielectric cap 154. However, in an alternative embodiment, sidewall surface 174 of dielectric cap 154 is coplanar with shield connection surface 164 of shield 152.

In this embodiment, body 160 of shield 152 is on a lower, e.g., first, surface 170L of body 170 of dielectric cap 154. Antenna 156 is on an upper, e.g., second, surface 170U of body 170 of dielectric cap 154. Instead of being on lower and upper surfaces 170L, 170U of dielectric cap 154, in an alternative embodiment, shield 152 and/or antenna 156 are embedded within dielectric cap 154, respectively.

As best shown in FIG. 1, antenna 156 is rectangular, e.g., square, when viewed from above. However, antenna 156 is formed in other shapes in other embodiments. To illustrate, antenna 156 is a rectangular annulus, a circular annulus, a solid circle or other shape. In one particular embodiment, antenna 156 is a square annulus, i.e., has a square hole 159 (indicated by the dashed line) in the middle.

Antenna strap 158 is electrically connected to antenna 156. In one embodiment, antenna strap 158 and antenna 156 are integral, i.e., are a single piece and not a plurality of separate pieces connected together. Generally, antenna strap 158 and antenna 156 are formed of an electrically conductive material. Illustratively, antenna strap 158 and antenna 156 are formed of a stamped, formed or deposited metal such as stainless-steel, copper or tin alloy.

An antenna section 176 of antenna strap 158 extends from antenna 156 to an edge 170E1 of upper surface 170U of dielectric cap 154. Antenna strap 158 bends around edge 170E1.

A sidewall section 178 of antenna strap 158 extends down from antenna section 176 and more generally down from upper surface 170U of body portion 170 of dielectric cap 154. Sidewall section 178 of antenna strap 158 extends down along and on sidewall 172. In this embodiment, sidewall section 178 of antenna strap 158 extends downwards towards substrate 102 beyond sidewall surface 174 of dielectric cap 154.

Sidewall section 178 of antenna strap 158 terminates at a foot 180 of antenna strap 158. Foot 180 is below sidewall surface 174 of dielectric cap 154. However, in an alternative embodiment, sidewall section 178 of antenna strap 158 extends only to sidewall surface 174 of dielectric cap 154 and foot 180 of antenna strap 158 is on, instead of below, sidewall surface 174.

In this embodiment, foot 180 is perpendicular to sidewall section 178. More particularly, foot 180 extends inwards towards electronic component 104 from sidewall section 178 of antenna strap 158. Foot 180 is electrically connected to end 136E2 of antenna trace 136 by an electrically conductive adhesive 184.

Illustratively, electrically conductive adhesive 184 is electrically conductive epoxy adhesive or solder although other electrically conductive adhesives are used in other embodiments. Electrically conductive adhesive 184 is not illustrated in FIG. 1 for purposes of clarity.

In certain applications, is important to electrically connect foot 180 to antenna trace 136 and also to a reference voltage source, e.g., ground. In one embodiment, foot 180 is formed to extend between shield 152 and upper surface 102U such that shield 152 is electrically connected to foot 180. In an alternative embodiment, foot 180 is formed to extend over an upper ground trace 122 such that the upper ground trace 122 is electrically connected to foot 180.

Figure 11:
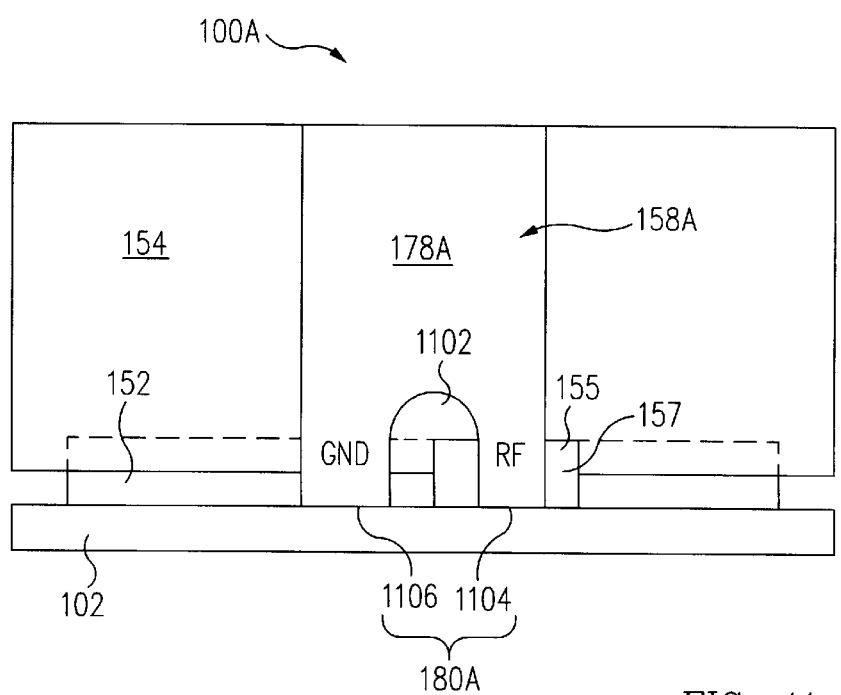
FIG. 11 is a side plan view of a transceiver package in accordance with an alternative embodiment of the present invention.

FIG. 11 is a side plan view of a transceiver package 100A in accordance with an alternative embodiment of the present invention. Referring now to FIG. 11, a sidewall section 178A of an antenna strap 158A includes a mouse hole 1102. Accordingly, foot 180A includes a first toe 1104 electrically connected to antenna trace 136 and a second toe 1106 connected to ground.

Referring again to FIGS. 1, 2, and 3, upper ground traces 122 on upper surface 102U of substrate 102 are formed adjacent side 102S of substrate 102. More particularly, upper ground traces 122 are formed around the entire periphery of upper surface 102U of substrate 102. Collectively, upper ground traces 122 form a shield ring 182 on upper surface 102U as indicated by the dashed line.

Shield ring 182 corresponds in shape to shield connection surface 164 of shield 152. More particularly, when antenna shield assembly 150 is mounted to substrate 102, shield connection surface 164 of shield 152 abuts shield ring 182 as best shown in FIG. 2. This allows shield ring 182 to be electrically connected to shield connection surface 164.

In one embodiment, shield ring 182 is electrically connected to shield connection surface 164 by electrically conductive adhesive 181, e.g., electrically conductive epoxy adhesive or solder although other electrically conductive adhesives are used in other embodiments. Electrically conductive adhesive 181 is not illustrated in FIG. 1 for purposes of clarity.

As best shown in FIG. 1, shield ring 182 defines a central region CR of upper surface 102U of substrate 102 inwards of shield ring 182. Of importance, the electronic components of transceiver package 100 are mounted to central region CR. To illustrate, electronic component 104, a second electronic component 186, a third electronic component 188, and a fourth electronic component 190 are mounted to central region CR, i.e., for a total of four electronic components. However, in alternative embodiments, more or less than four electronic components are mounted to central region CR.

Further, instead of being mounted to upper surface 102U of substrate 102, electronic components 104, 186, 188 and/or 190 are embedded within substrate 102 below central region CR in one embodiment. For example, substrate 102 is a multilayer substrate, e.g., a multilayer laminate substrate, and electronic components 104, 186, 188 and/or 190 are formed on an interlayer of substrate 102.

Illustratively, electronic components 104, 186, 188, and 190 are semiconductor devices, discrete passive devices such as resistors, capacitors or inductors, discrete active devices, application-specific integrated circuits (ASICs), integrated passive networks or combinations thereof although other electronic components are used in other embodiments.

Shield 152 functions as a shield to protect electronic components 104, 186, 188, and 190 from radiation. Examples of radiation of interest include electromagnetic radiation or radio frequency (RF) radiation. Stated another way, shield 152 shields electronic components 104, 186, 188, and 190 from interference such as electromagnetic interference (EMI) or radio frequency interference (RFI). Further, shield 152 functions as a shield to prevent electronic components 104, 186, 188 and 190 from emanating unwanted radiation to electronic components, structures, and/or air adjacent transceiver package 100.

As set forth above, shield 152 is formed of an electrically conductive material and is electrically connected to shield ring 182. More generally, shield 152 is physically and electrically connected to upper ground traces 122 including upper ground trace 122A.

As set forth above, upper ground trace 122A is electrically connected to ground interconnection ball 130A. Accordingly, shield 152 is electrically connected to ground interconnection ball 130A.

During use, ground interconnection ball 130A is electrically connected to a reference voltage source, e.g., ground. Accordingly, shield 152 is electrically connected to the reference voltage source and held at a common potential, e.g., ground. Thus, shield 152 is a ground shield that encloses electronic components 104, 186, 188, and 190. More particularly, body 160 of shield 152 is a ground shield above electronic components 104, 186, 188, and 190. Sidewall 162 of shield 152 is a ground shield around electronic components 104, 186, 188, and 190.

Further, ground vias 126 collectively form a ground shield around the entire periphery and adjacent side 102S of substrate 102, this ground shield extending from upper surface 102U to lower surface 102L of substrate 102. Ground vias 126 are grounded by ground interconnection balls 130 for reasons similar to those set forth above regarding shield 152. As those of skill in the art will understand, by spacing ground vias 126 sufficiently close to one another, radiation is prevented from passing between ground vias 126. Accordingly, ground vias 126 prevent lateral transmission of radiation through side 102S of substrate 102. In this manner, ground vias 126 form a ground shield below and beside electronic components 104, 186, 188, and 190.

In one embodiment, substrate 102 and/or the larger substrate, e.g. the printed circuit mother board, to which transceiver package 100 is mounted, is formed with a ground plane. This ground plane prevents radiation from passing through upper surface 102U of substrate 102. The use of a substrate and/or printed circuit mother board having a ground plane is discussed further below in reference to FIG. 10. Advantageously, electronic components 104, 186, 188, and 190 are completely shielded from radiation in all directions. Further, electronic components, structures and/or air adjacent transceiver package 100 are shielded from radiation emanating from electronic components 104, 186, 188, and 190.

During use, electronic component 104 generates an electromagnetic signal on bond pad 108B, hereinafter referred to as an RF signal, e.g., a 2.5 gigahertz signal although other frequency signals are used in other embodiments. This RF signal propagates to antenna 156 via bond wire 112B, antenna trace 136, and antenna strap 158 (and other electronic components, e.g., a balun filter, if used). This RF signal causes radiation, e.g., RF radiation, to emanate from antenna 156.

As those of skill in the art will understand, to allow an antenna to generate radiation, a reference conductor is necessary. Advantageously, shield 152 forms the reference conductor, sometimes called ground plane, for antenna 156. More specifically, as best shown in FIG. 2, shield 152 is a ground plane spaced apart from antenna 156 by body 170 of dielectric cap 154. Generally, dielectric cap 154 is interposed between and electrically isolates shield 152 from antenna 156.

Figure 10:
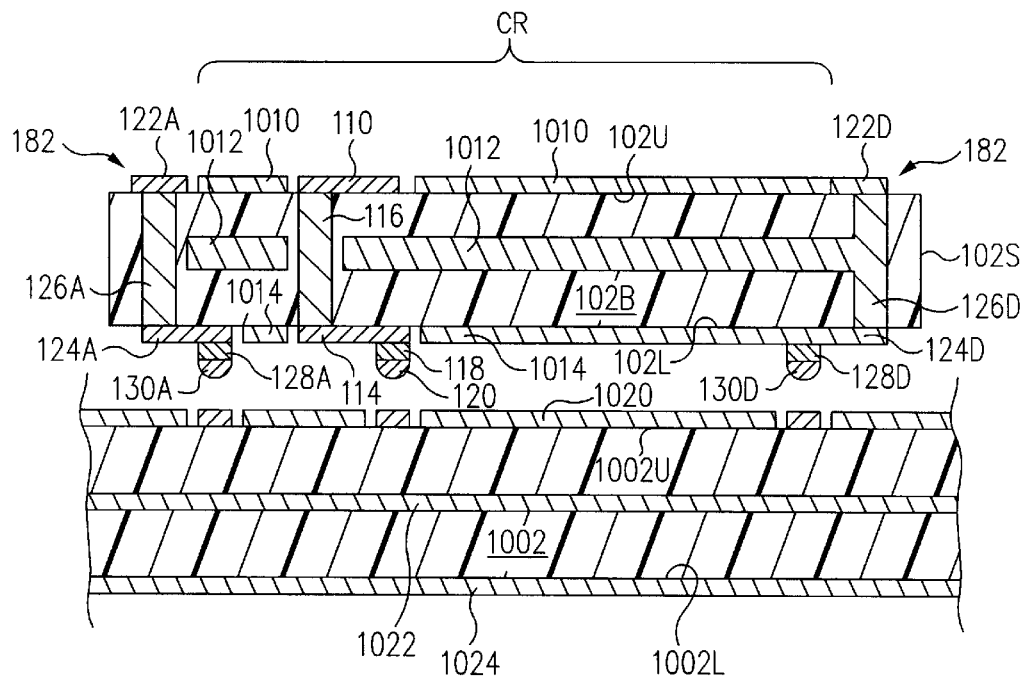
FIG. 10 is a cross-sectional view of a substrate and a larger substrate to which the substrate is mounted in accordance with one embodiment of the present invention.

In one embodiment, shield 152 is electrically connected to other ground structures, e.g., to a ground plane such as that illustrated in FIG. 10. In accordance with this embodiment, shield 152 and these other ground structures collectively form the ground plane for antenna 156.

Although transmission of an RF signal from antenna 156 is described above, in light of this disclosure, it is understood that antenna 156 is also a receiver of radiation, e.g., RF radiation. This received radiation results in the formation of an electromagnetic signal on bond pad 108B via antenna strap 158, antenna trace 136, and bond wire 112B (and other electronic components, e.g., a balun filter, if used). Accordingly, transceiver package 100 receives and transmits radiation during use.

Advantageously, shield 152 serves a least two functions. First, shield 152 shields electronic components 104, 186, 188, and 190. More particularly, shield 152 prevent electronic components 104, 186, 188 and 190 from receiving unwanted radiation, e.g., generated by antenna 156 or received from the surrounding air. Further, shield 152 prevents electronic components 104, 186, 188, and 190 from emanating unwanted radiation, e.g., to electronic components adjacent transceiver package 100 or to the surrounding air. Accordingly, transceiver package 100 is well suited for wireless applications such as portable radio transmitters, portable telephones, portable radio receivers or other high frequency applications, which require shielding of electronic components.

Recall that in the prior art, shielding was accomplished by placing an electrically conductive metallic enclosure around the integrated circuit package after the integrated circuit package was mounted to the larger substrate such as the printed circuit mother board. By eliminating this electrically conductive metallic enclosure, an electronic device, e.g., cellular telephone, employing transceiver package 100 in accordance with the present invention is fabricated to be smaller, lighter and less expensive than an electronic device of the prior art.

Second, shield 152 is a ground plane for antenna 156. Advantageously, antenna 156 is fabricated as part of transceiver package 100. This is in stark contrast to the prior art where the antenna, which was a structure separate from the integrated circuit package, was attached separately to the printed circuit mother board. By incorporating antenna 156 into transceiver package 100, an electronic device, e.g., cellular telephone, employing transceiver package 100 in accordance with the present invention is fabricated to be smaller, lighter and less expensive than an electronic device of the prior art.

Further, by incorporating antenna 156 into transceiver package 100, transceiver package 100 is highly manufacturable compared to the prior art. As set forth above, the antenna of the prior art was attached separately to the printed circuit mother board. Disadvantageously, attaching the antenna at the printed circuit mother board stage of fabrication was labor intensive, complex and thus expensive. Further, specialized expertise, e.g., in RF circuitry, was required in designing and attaching the antenna to the printed circuit mother board.

In stark contrast to the prior art, antenna 156 is incorporated into transceiver package 100. This simplifies manufacturing at the printed circuit mother board stage of fabrication thus reducing cost. Further, transceiver package 100 is an off-the-shelf part and no specialized expertise is required to use transceiver package 100. This allows a wide variety of manufacturers to use transceiver package 100 to enter into the wireless marketplace.

Figure 4:
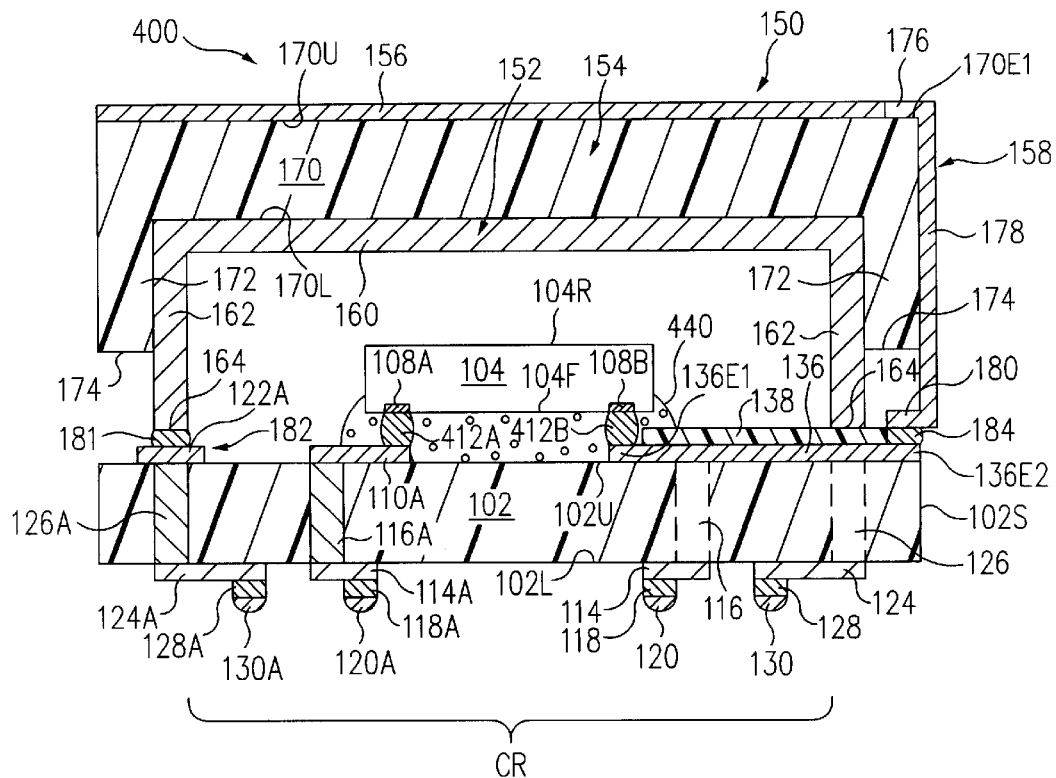
FIG. 4 is a cross-sectional view of a transceiver package in accordance with an alternative embodiment of the present invention.

FIG. 4 is a cross-sectional view of a transceiver package 400 in accordance with an alternative embodiment of the present invention. Transceiver package 400 of FIG. 4 is substantially similar to transceiver package 100 of FIG. 2 and only the significant differences are discussed below.

Referring now to FIG. 4, in this embodiment, electronic component 104 is flip chip mounted to substrate 102. More particularly, electronic component 104 is mounted to substrate 102 by bumps 412 including a first bump 412A and a second bump 412B. Bumps 412 physically and electrically connect bond pads 108 to upper traces 110 and antenna trace 136. To illustrate, bumps 412A, 412B physically and electrically connect bond pads 108A, 108B to upper trace 110A and antenna trace 136, respectively.

In this embodiment, to insure the reliability of the mounting of electronic component 104 to substrate 102, an underfill material 440 is applied to enclose bumps 412 and generally to fill the spaced between front surface 104F of electronic component 104 and upper surface 102U of substrate 102.

Figure 5:
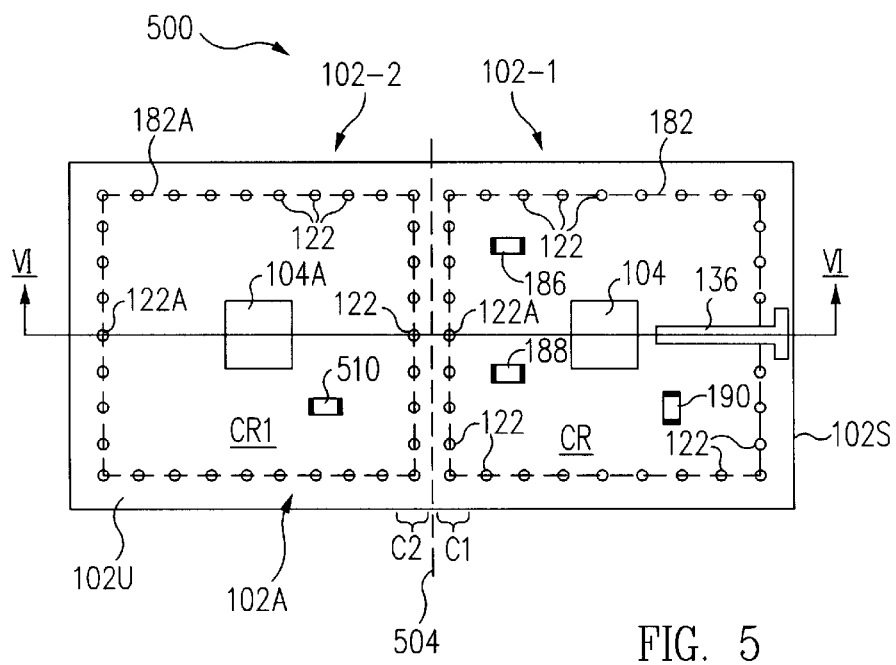
FIG. 5 is a top plan view of a multi-chip substrate of a multi-chip transceiver package in accordance with one embodiment of the present invention.
Figure 6:
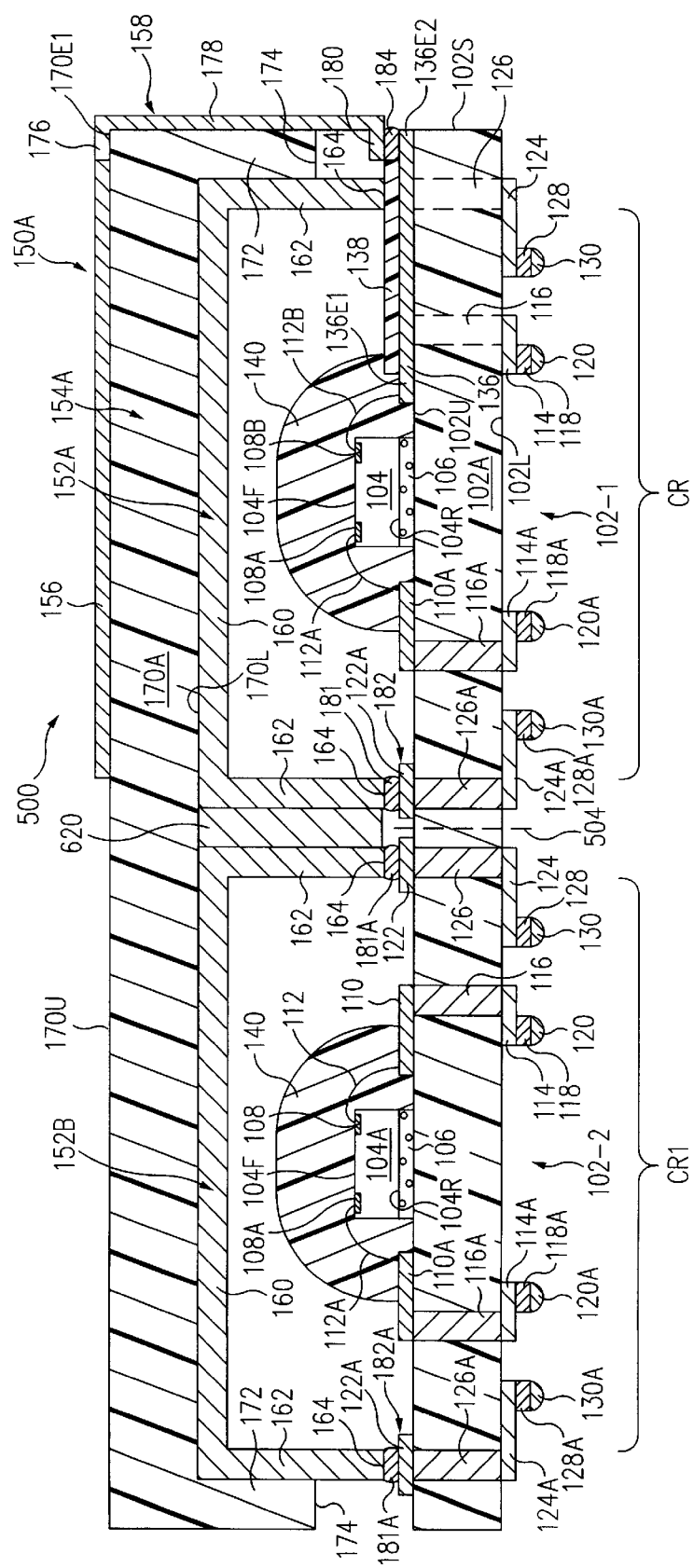
FIG. 6 is a cross-sectional view of the multi-chip transceiver package along the line VI—VI of FIG. 5.

FIG. 5 is a top plan view of a multi-chip substrate 102A of a multi-chip transceiver package 500 in accordance with one embodiment of the present invention. FIG. 6 is a cross-sectional view of multi-chip transceiver package 500 along the line VI—VI of FIG. 5. Multi-chip transceiver package 500 of FIGS. 5 and 6 is similar in many respects to transceiver package 100 of FIG. 2 and only the significant differences are discussed below.

Referring now to FIG. 5, only electronic components 104, 104A, 186, 188, 190, 510, upper ground traces 122 and antenna trace 136 are illustrated for purposes of clarity although it is understood that upper surface 102U of multi-chip substrate 102A contains additional features, e.g., as shown in FIG. 6.

Referring now to FIGS. 5 and 6 together, multi-chip substrate 102A includes two substrates 102-1, 102-2. Substrates 102-1, 102-2 are integrally connected together at a boundary 504 of multi-chip substrate 102A. Substrate 102-1 is substantially similar to substrate 102 of FIG. 1. Substrate 102-2 is substantially similar to substrate 102 of FIG. 1, except that substrate 102-2 is formed without antenna trace 136 in this embodiment. Although multi-chip substrate 102A is illustrated as having two substrates 102-1, 102-2, in alternative embodiments, multi-chip substrate 102A includes more than two substrates integrally connected together.

Transceiver package 500 further includes a first shield 152A and a second shield 152B. Shields 152A, 152B are substantially similar to shield 152 of FIG. 1.

In accordance with this embodiment, multi-chip substrate 102A has an upper surface 102U having two separately shielded regions, i.e., a first central region CR and a second central region CR1. Central region CR is inwards and defined by a first shield ring 182 in a manner substantially similar to that illustrated in FIG. 1, shield ring 182 being indicated by a dashed line.

Central region CR1 is inwards and defined by a second shield ring 182A, which is substantially similar to shield ring 182. Specifically, a second set of upper ground traces 122 defines shield ring 182A as indicated by the dashed line.

In this embodiment, electronic components 104, 186, 188 and 190 are mounted to upper surface 102U of multi-chip substrate 102A within central region CR. Similarly, electronic components 104A, 510 are mounted to upper surface 102U of multi-chip substrate 102A within central region CR1. Generally, any number of electronic components are mounted, e.g., in wire bond, flip chip and/or surface mount configurations, within or below central regions CR, CR1 and it is understood that other configurations besides that illustrated in FIGS. 5 and 6 are possible.

Shield 152A encloses electronic components 104, 186, 188 and 190. Similarly, shield 152B encloses electronic components 104A, 510. Advantageously, shields 152A, 152B are electrically connected to shield rings 182, 182A by electrically conductive adhesives 181, 181A, respectively. For reasons similar to those discussed above with regards to shield 152 of FIG. 1, shields 152A, 152B are grounded during use. Thus, shield 152A is a ground shield above and around electronic components 104, 186, 188 and 190 and shield 152B is a ground shield above and around electronic components 104A, 510.

Ground vias 126 prevent lateral transmission of radiation through side 102S of multi-chip substrate 102A and through multi-chip substrate 102A across boundary 504 for reasons similar to those discussed with regards to ground vias 126 of FIG. 1. In this manner, ground vias 126 form ground shields below and beside electronic components 104, 186, 188, and 190 and electronic components 104A, 510.

In one embodiment, multi-chip substrate 102A and/or the larger substrate, e.g. the printed circuit mother board, to which transceiver package 500 is mounted, is formed with a ground plane. This ground plane prevents radiation from passing through upper surface 102U of multi-chip substrate 102A. The use of a substrate and/or printed circuit mother board having a ground plane is discussed further below in reference to FIG. 10. Advantageously, electronic components 104, 186, 188, and 190 and electronic components 104A, 510 are completely shielded from radiation in all directions. Further, electronic components, structures and air adjacent transceiver package 500 are shielded from radiation emanating from electronic components 104, 186, 188, 190, 104A, and 510.

Of importance, electronic components 104A, 510 are shielded by shield 152B separately from electronic components 104, 186, 188 and 190, which are shielded by shield 152A. Generally, electronic components 104A, 510 are shielded from electronic components 104, 186, 188, 190 and vice versa by shields 152A, 152B. Accordingly, adverse electromagnetic interference of electronic components 104A, 510 from electronic components 104, 186, 188 and 190 and vice versa is prevented.

In one embodiment, instead of grounding shield 152A by shield ring 182 separate from shield 152B by shield ring 182A as illustrated in FIG. 6, shield 152A and shield 152B are commonly grounded. For example, shields 152A, 152B are electrically connected directly to one another by an electrically conductive bridge portion 620, which extends across boundary 504. For example, shields 152A, 152B are integrally connected together by bridge portion 620. However, in an alternative embodiment, bridge portion 620 is a dielectric material, e.g., is air or a section of a dielectric cap 154A.

In one embodiment, shields 152A, 152B are electrically connected to common upper ground traces 122. To illustrate, referring now to FIG. 5, shield ring 182 includes a first column C1 of upper ground traces 122 directly adjacent boundary 504. Similarly, shield ring 182A includes a second column C2 of upper ground traces 122 directly adjacent boundary 504. Columns C1, C2 are directly opposite one another with respect to boundary 504.

In accordance with one embodiment, either column C1 or column C2 is formed, but not both. Of course, the corresponding ground vias 126, lower ground traces 124, ground pads 128 and ground interconnection balls 130 associated with the upper ground traces 122 of the column not formed would likewise not be formed. In accordance with this embodiment, shields 152A, 152B are both electrically connected to the remaining column C1 or C2 in a manner similar to that discussed below with reference to FIGS. 7 and 8.

Figure 7:
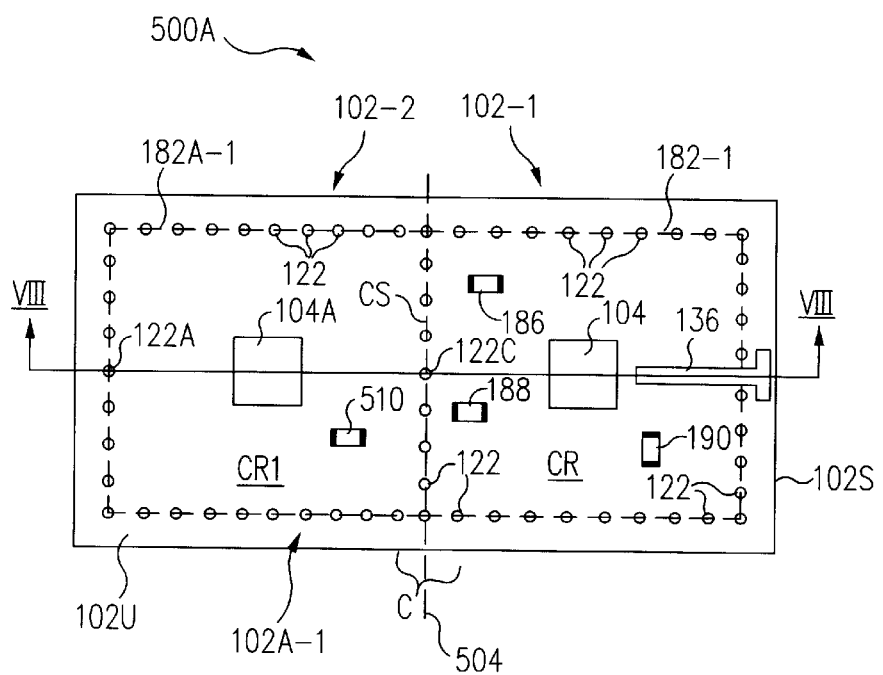
FIG. 7 is a top plan view of a multi-chip substrate of a multi-chip transceiver package in accordance with another embodiment of the present invention.
Figure 8:
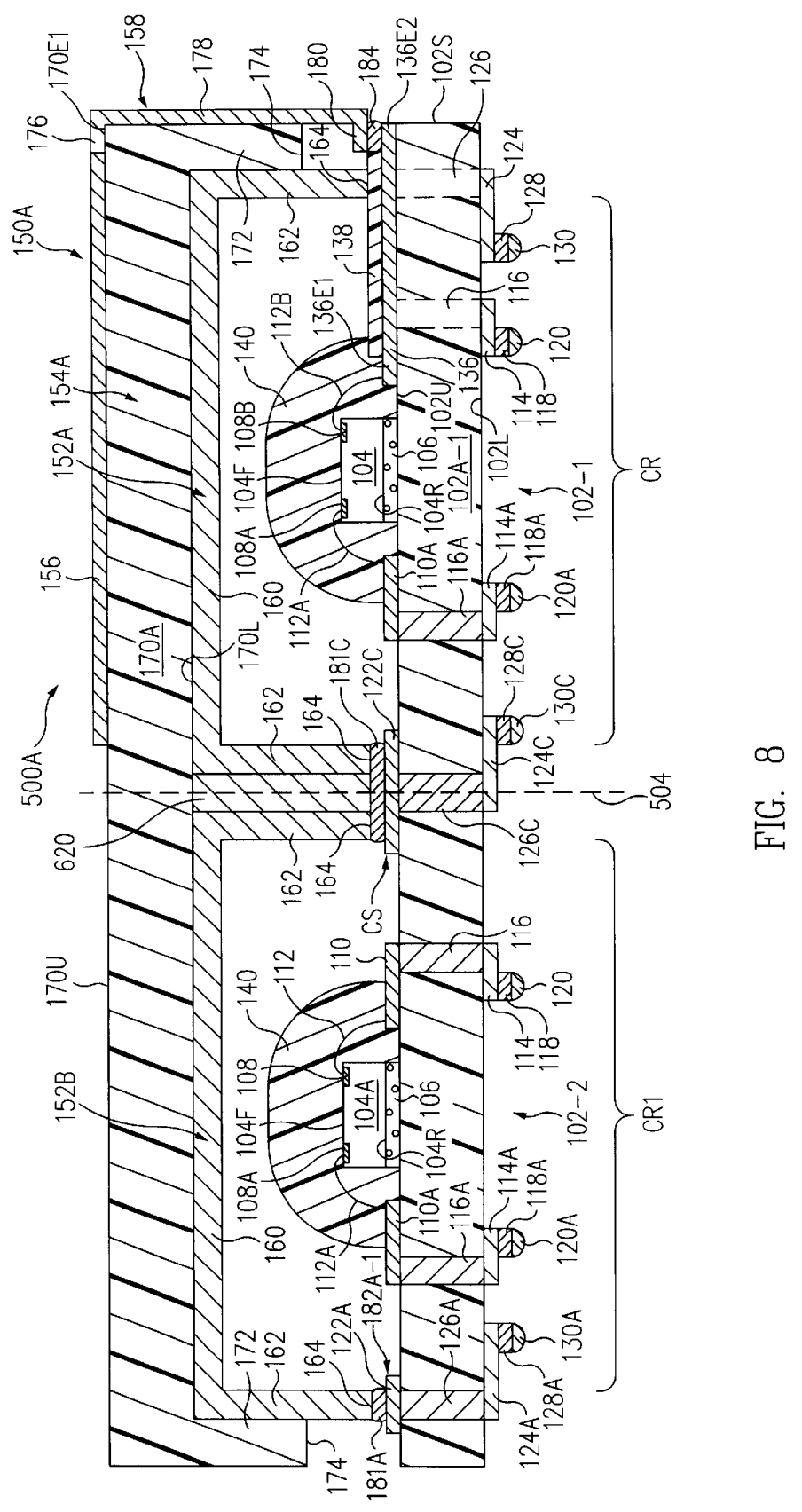

FIG. 7 is a top plan view of a multi-chip substrate 102A-1 of a multi-chip transceiver package 500A in accordance with one embodiment of the present invention. FIG. 8 is a cross-sectional view of multi-chip transceiver package 500A along the line VIII—VIII of FIG. 7. Multi-chip transceiver package 500A of FIGS. 7 and 8 is substantially similar to multi-chip transceiver package 500 of FIGS. 5 and 6 and only the significant differences are discussed below.

Referring now to FIGS. 7 and 8 together, upper surface 102U of multi-chip substrate 102A-1 has central regions CR, CR1. Central regions CR, CR1 are inwards and defined by shield rings 182-1, 182A-1, respectively. In accordance with this embodiment, shield rings 182-1, 182A-1 share a common side CS. Common side CS of shield rings 182-1, 182A-1 extends directly along the length of boundary 504, although, in alternative embodiments, common side CS is offset on either side of boundary 504.

Shield rings 182-1, 182A-1 share an upper ground trace 122C of the plurality of upper ground traces 122. Upper ground trace 122C is one of a column C, sometimes called a set, of upper ground traces 122 which define common side CS. Shields 152A, 152B are both electrically and physically connected to column C of upper ground traces 122 by electrically conductive adhesive 181C.

Upper ground trace 122C is electrically connected to a ground interconnection ball 130C of the plurality of ground interconnection balls 130 by a ground via 126C, a lower ground trace 124C and a ground pad 128C of the plurality of ground vias 126, ground traces 124 and ground pads 128, respectively. The set of ground vias 126 formed along or adjacent boundary 504 and electrically connected to column C of upper ground traces 122 prevent radiation transmission through multi-chip substrate 102A-1 across boundary 504.

Referring again to FIG. 6, shields 152A, 152B are enclosed, sometimes called captured, within dielectric cap 154A, which is formed of a dielectric material such as plastic or ceramic although other dielectric materials are used in other embodiments. Of importance, antenna 156 is spaced apart from shield 152A by dielectric cap 154A in a manner similar to that described above with regards to antenna 156, shield 152, and dielectric cap 154 of FIG. 1. Advantageously, shield 152A forms a ground plane spaced apart from antenna 156 by body 170A of dielectric cap 154A.

Figure 9:
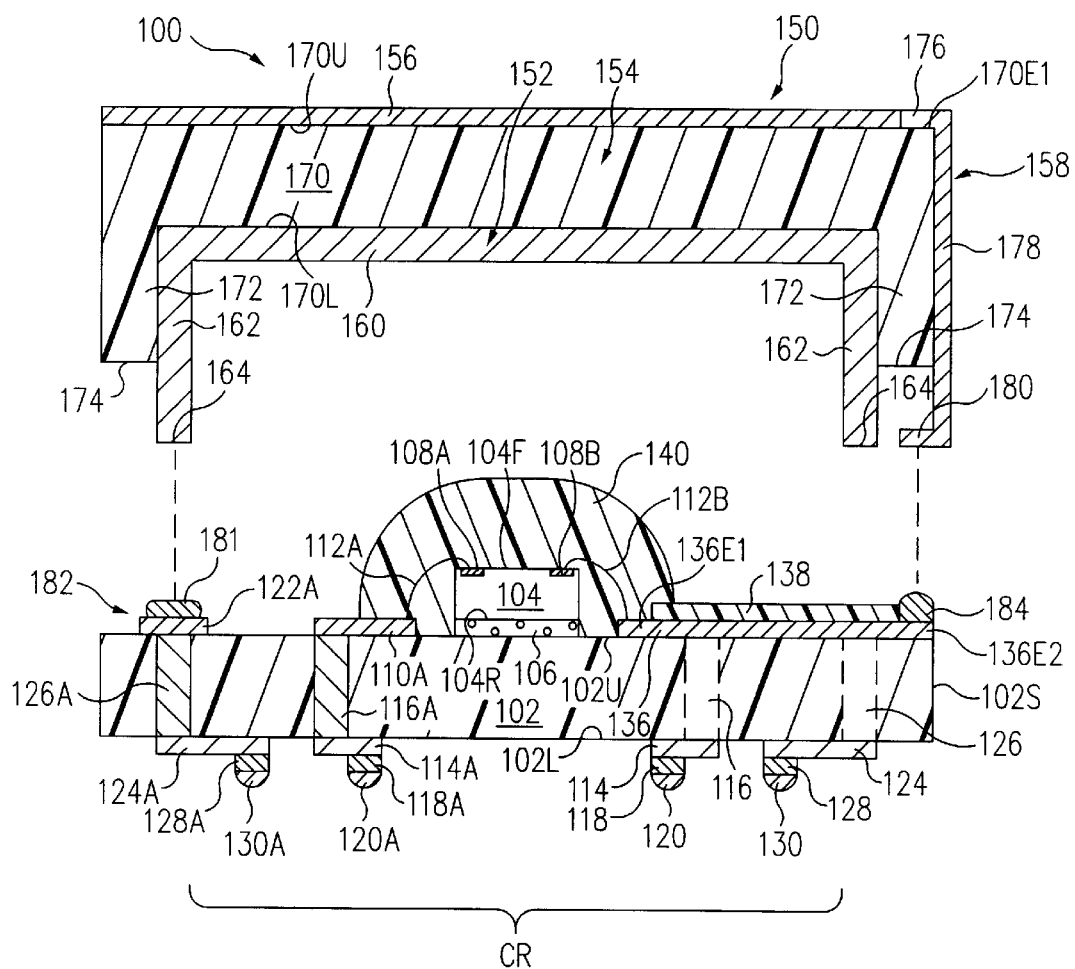
FIG. 9 is a cross-sectional view of the transceiver package of FIGS. 1 and 2 during fabrication in accordance with one embodiment of the present invention.

FIG. 9 is a cross-sectional view of transceiver package 100 of FIGS. 1 and 2 during fabrication in accordance with one embodiment of the present invention. Referring now to FIG. 9, substrate 102 is fabricated. Fabrication of substrate 102 includes the formation of antenna trace 136, upper ground traces 122, and more generally shield ring 182 on upper surface 102U. Generally, an electrically conductive layer is formed and patterned or is selectively formed to form antenna trace 136 and upper ground traces 122.

Fabrication of substrate 102 also includes the formation of ground vias 126. Illustratively, holes are formed in substrate 102, e.g., by drilling, and these holes are filled with an electrically conductive material to form ground vias 126.

Rear surface 104R of electronic component 104 is mounted to upper surface 102U of substrate 102, e.g., with adhesive 106 in a conventional manner. Bond pads 108 are electrically connected to upper traces 110 and antenna trace 136 by bond wires 112, e.g., by wirebonding in a conventional manner. Electronic component 104 and bond wires 112 are glob top encapsulated in encapsulant 140.

Although a wirebonding configuration of electronic component 104 is illustrated in FIG. 9, is understood that other configurations, e.g., a flip chip configuration such as that illustrated in FIG. 4, are used in other embodiments. Generally, electronic components such as electronic components 104, 186, 188 and 190 of FIG. 1 are mounted, e.g., in wire bond, flip chip, or surface mount configurations, to central region CR of upper surface 102U of substrate 102. The particular method used to mount these electronic components is not essential to the invention.

Antenna shield assembly 150 is formed. In one embodiment, dielectric cap 154 is formed, e.g., by plastic injection molding. Shield 152 is formed, e.g., by stamping a piece of metal. Similarly, antenna 156 and antenna strap 158 are formed, e.g., by stamping a piece of metal. Shield 152 is mounted to dielectric cap 154. Similarly, antenna 156 and antenna strap 158 are mounted to dielectric cap 154.

Shield 152, antenna 156 and antenna strap 158 are mounted to dielectric cap 154 using any one of a number of techniques. In one embodiment, shield 152, antenna 156 and antenna strap 158 are mounted to dielectric cap 154 with an adhesive. In another embodiment, shield 152, antenna 156 and antenna strap 158 are mounted to dielectric cap 154 by heat staking, i.e., by heating and pressing shield 152, antenna 156 and antenna strap 158 into dielectric cap 154.

In an alternative embodiment, shield 152, antenna 156 and antenna strap 158 are formed directly on dielectric cap 154. For example, an electrically conductive material is deposited, e.g., by sputtering, on dielectric cap 154. This electrically conductive material is patterned, e.g., by masking and etching the electrically conductive material, to form shield 152, antenna 156 and antenna strap 158. Alternatively, the electrically conductive material is deposited selectively, e.g., using a mask on dielectric cap 154 before deposition of the electrically conductive material, to form shield 152, antenna 156 and antenna strap 158.

As shown in FIG. 9, electrically conductive adhesives 181, 184 are applied to upper ground traces 122, antenna trace 136, respectively. In an alternative embodiment, instead of applying electrically conductive adhesives 181, 184 to upper ground traces 122, antenna trace 136 as shown in FIG. 9, electrically conductive adhesives 181, 184 are applied to shield connection surface 164 of shield 152 and to foot 180 of antenna strap 158, respectively.

In one embodiment, electrically conductive adhesives 181, 184 are electrically conductive epoxy adhesives applied, for example, with a needle dispenser. In another embodiment, electrically conductive adhesives 181, 184 are solder paste applied, for example, by screening.

Antenna shield assembly 150 is aligned with substrate 102. More particularly, shield connection surface 164 of shield 152 and foot 180 of antenna strap 158 are aligned to shield ring 182 and end 136E2 of antenna trace 136, respectively. Antenna shield assembly 150 is mounted to substrate 102.

More particularly, referring now to FIG. 2, antenna shield assembly 150 is moved into contact with substrate 102. At this time, adhesive 181 is interposed between shield connection surface 164 of shield 152 and upper ground traces 122. Simultaneously, adhesive 184 is interposed between foot 180 and end 136E2 of antenna trace 136.

Adhesives 181, 184 are cured thus electrically and physically connecting shield connection surface 164 of shield 152 to upper ground traces 122 and foot 180 to end 136E2 of antenna trace 136. In one embodiment, adhesives 181, 184 are electrically conductive epoxy adhesives and are cured by heating. In another embodiment, adhesives 181, 184 are solder paste and are cured by heating to a melt, sometimes called reflowing, the solder paste. Interconnection balls 120, 130 are formed on pads 118, 128, respectively, completing fabrication of transceiver package 100.

FIG. 10 is a cross-sectional view of a substrate 102B and a larger substrate 1002, e.g., a printed circuit mother board, to which substrate 102B is mounted in accordance with one embodiment of the present invention.

Referring now to FIG. 10, an electrically conductive upper, e.g., first, ground plane 1010 is formed on upper surface 102U of substrate 102B. Upper ground plane 1010 is patterned around the various features on upper surface 102U. For example, upper ground plane 1010 is patterned around upper traces 110. Upper ground plane 1010 is also patterned around upper ground traces 122, for example, is patterned around upper ground trace 122A as shown in FIG. 10. Alternatively, upper ground plane 1010 is electrically connected to one or more of upper ground traces 122. For example, upper ground plane 1010 is electrically connected to, or integral with, an upper ground trace 122D of the plurality of upper ground traces 122.

During use, upper ground plane 1010 is electrically connected to a reference voltage source, e.g., ground. Accordingly, upper ground plane 1010 is held at a common potential, e.g., ground. For example, upper ground trace 122D is grounded through interconnection ball 130D thus grounding upper ground plane 1010 although it is understood that upper ground plane 1010 is grounded in other manners in other embodiments.

Advantageously, upper ground plane 1010 is formed on central region CR of upper surface 102U of substrate 102B. Accordingly, upper ground plane 1010 prevents radiation from passing through and out of substrate 102B. In this manner, electronic components (not shown in FIG. 10, see FIG. 1 for example) mounted to central region CR of upper surface 102U are shielded from radiation.

In an alternative embodiment, substrate 102B includes an electrically conductive internal, e.g., second, ground plane 1012. Illustratively, substrate 102B is a multilayer laminate substrate and internal ground plane 1012 is formed on an interlayer metallization layer of substrate 102B. Internal ground plane 1012 is patterned around the various features of this interlayer metallization layer. For example, internal ground plane 1012 is patterned around vias 116 and ground vias 126. To illustrate, internal ground plane 1012 is patterned around ground via 126A. Alternatively, internal ground plane 1012 is electrically connected to one or more of ground via 126. For example, internal ground plane 1012 is electrically connected to, or integral with, a ground via 126D of the plurality of ground vias 126.

During use, internal ground plane 1012 is electrically connected to a reference voltage source, e.g., ground. Accordingly, internal ground plane 1012 is held at a common potential, e.g., ground. For example, ground via 126D is grounded through interconnection ball 130D thus grounding internal ground plane 1012 although it is understood that internal ground plane 1012 is grounded in other manners in other embodiments.

Advantageously, internal ground plane 1012 is formed directly below central region CR of upper surface 102U of substrate 102B. Accordingly, internal ground plane 1012 prevents radiation from passing through substrate 102B. In this manner, electronic components (not shown in FIG. 10, see FIG. 1 for example) mounted to central region CR of upper surface 102U are shielded from radiation.

In yet another alternative embodiment, an electrically conductive lower, e.g., third, ground plane 1014 is formed on lower surface 102L of substrate 102B. Lower ground plane 1014 is patterned around the various features on lower surface 102L. For example, lower ground plane 1014 is patterned around lower traces 114. Lower ground plane 1014 is also patterned around lower ground traces 124, for example, is patterned around lower ground trace 124A as shown in FIG. 10. Alternatively, lower ground plane 1014 is electrically connected to one or more of lower ground traces 124. For example, lower ground plane 1014 is electrically connected to, or integral with, a lower ground trace 124D of the plurality of lower ground traces 124.

During use, lower ground plane 1014 is electrically connected to a reference voltage source, e.g., ground. Accordingly, lower ground plane 1014 is held at a common potential, e.g., ground. For example, lower ground trace 124D is grounded through interconnection ball 130D thus grounding lower ground plane 1014 although it is understood that lower ground plane 1014 is grounded in other manners in other embodiments.

Advantageously, lower ground plane 1014 is formed directly below central region CR of upper surface 102U of substrate 102B. Accordingly, lower ground plane 1014 prevents radiation from passing through substrate 102B. In this manner, electronic components (not shown in FIG. 10, see FIG. 1 for example) mounted to central region CR of upper surface 102U are shielded from radiation.

In yet another alternative embodiment, larger substrate 1002, hereinafter referred to as mother board 1002, is formed with a ground plane directly below central region CR of upper surface 102U of substrate 102B. For example, mother board 1002 is formed with an upper, e.g., first, ground plane 1020 or a lower, e.g., second, ground plane 1024 on an upper, e.g., first, surface 1002U or a lower, e.g., second, surface 1002L, respectively, of mother board 1002. As another example, mother board 1002 is formed with an internal ground plane 1022 between upper surface 1002U and lower surface 1002L of mother board 1002.

During use, ground planes 1020, 1022 and/or 1024 are electrically connected to a reference voltage source, e.g., ground. Accordingly, ground planes 1020, 1022 and/or 1024 are held at a common potential, e.g., ground.

Advantageously, ground planes 1020, 1022 and/or 1024 are formed directly below central region CR of upper surface 102U of substrate 102B. Ground planes 1020, 1022 and/or 1024 prevent radiation from passing through and out of mother board 1002. In this manner, electronic components (not shown in FIG. 10, see FIG. 1 for example) mounted to central region CR of upper surface 102U are shielded from radiation.

Although ground planes 1010, 1012, 1014, 1020, 1022, and 1024 are illustrated in FIG. 10, generally, only one or more of ground planes 1010, 1012, 1014, 1020, 1022, and 1024 are formed.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An electronic component package comprising:

a substrate having a first surface;

an electronic component coupled to said first surface;

a shield enclosing said electronic component, said shield shielding said electronic component from radiation;

an antenna;

a dielectric cap interposed between said shield and said antenna, said shield being a ground plane for said antenna; and a shield ring coupled to said first surface of said substrate, said shield ring defining a central region of said first surface of said substrate, said electronic component being coupled to said central region.

2. The electronic component package of claim 1 wherein said shield is electrically coupled to said shield ring.

3. The electronic component package of claim 1 wherein said dielectric cap comprises a first surface and a second surface, said shield being coupled to said first surface of said dielectric cap, said antenna being coupled to said second surface of said dielectric cap.

4. The electronic component package of claim 1 wherein said antenna is embedded within said dielectric cap.

5. An electronic component package comprising:

a substrate having a first surface;

an electronic component coupled to said first surface;

a shield enclosing said electronic component, said shield shielding said electronic component from radiation;

an antenna;

a dielectric cap interposed between said shield and said antenna, said shield being a ground plane for said antenna;

an antenna trace coupled to said first surface of said substrate, wherein a bond pad of said electronic component is electrically coupled to said antenna trace; and an antenna strap electrically coupling said antenna to said antenna trace.

6. The electronic component package of claim 5 wherein said antenna strap is electrically coupled to said antenna trace by an electrically conductive adhesive.

7. The electronic component package of claim 6 wherein said electrically conductive adhesive is selected from the group consisting of epoxy adhesive and solder.

8. The electronic component package of claim 5 wherein said antenna strap comprises:

an antenna section electrically coupled to said antenna;

a foot electrically coupled to said antenna trace; and a sidewall section electrically coupled to said antenna section and to said foot.

9. The electronic component package of claim 8 wherein said foot is perpendicular to said sidewall section.

10. An electronic component package comprising:

a substrate having a first surface;

an electronic component coupled to said first surface;

a shield enclosing said electronic component, said shield shielding said electronic component from radiation;

an antenna;

a dielectric cap spacing said shield from said antenna, said shield being a ground plane for said antenna, wherein said shield is embedded within said dielectric cap; and a shield ring coupled to said first surface of said substrate, said shield ring defining a central region of said first surface of said substrate, said electronic component being coupled to said central region.

11. An electronic component package comprising:

a substrate comprising a means for defining a central region of a first surface of said substrate;

means for coupling an electronic component to said central region;

means for shielding said electronic component; and means for transmitting and receiving radiation, wherein said means for shielding forms a ground plane for said means for transmitting and receiving radiation.

* * * * *